ELECTRICAL SIGNAL POWER AMPLIFIER

Filed Jan. 31, 1956

*INVENTOR.*
JOHN PARNELL

BY Arthur H. Swanson

ATTORNEY.

United States Patent Office 2,920,282

Patented Jan. 5, 1960

2,920,282

ELECTRICAL SIGNAL POWER AMPLIFIER

John Parnell, Philadelphia, Pa., assignor to Minneapolis-Honeywell Regulator Company, Minneapolis, Minn., a corporation of Delaware Application January 31, 1956, Serial No. 562,464

5 Claims. (Cl. 330—181)

A general object of the present invention is to provide an improved electrical signal power amplifier. More specifically, the present invention is concerned with an improved power amplifier which is characterized by its wide frequency response and its low output impedance.

Cathode follower amplifier circuits are well adapted for low output impedance circuit requirements. The extent, however, to which a low output impedance can effectively be obtained with a cathode follower circuit is limited so that with the conventional cathode follower circuit and its low gain, it is impossible to use such a circuit to advantage in many applications. The present invention is directed to an improved circuit which may effectively be used to provide output impedances as low as a fraction of an ohm, while maintaining the overall gain of this circuit at substantially unity. This low output impedance and gain characteristic is achieved in the present invention without sacrificing the signal transmitting characteristics of the circuit so that it is possible to pass a wide band of frequencies with a minimum of distortion.

It is, therefore, a further object of the present invention to provide an improved amplifier circuit having a very low output impedance and a gain of substantially unity.

The circuit of the present amplifier has been especially arranged with a pair of amplifying devices interconnected so that the cathode impedance of the output amplifying device is connected into the input circuit of the input device while the output of the amplifier is taken directly from the cathode and anode of the output device. This circuit configuration effectively eliminates the presence of the power supply impedance in the output circuit and thus provides a lower output impedance. The impedance of the output when utilized in this particular manner may be approximated by dividing the plate resistance of the output amplifying device by the product of the gains of the input and output devices.

It is accordingly a further more specific object of the present invention to provide an improved low impedance amplifier which is characterized by having an output impedance approximately equal to the plate resistance of the output device divided by the product of the gains of the input and output device.

Another more specific object of the present invention is to provide an improved apparatus including a pair of amplifying devices, one of which is an input device, and the other of which is an output device so interconnected that the cathode impedance of the output device is connected in the input circuit of the input device and the output of the circuit is taken directly from the output electrodes of the output device.

The various features of novelty which characterize the invention are pointed out with particularity in the claims annexed to and forming a part of this specification. For a better understanding of the invention, its advantages, and specific objects attained with its use, reference should be had to the accompanying drawings and descriptive matter in which there is illustrated and described a preferred embodiment of the invention.

Figure 1:
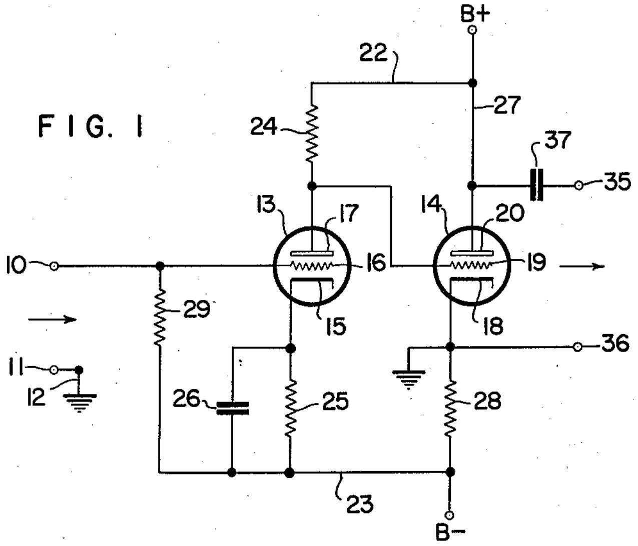
Fig. 1 shows the amplifier with direct coupling between the amplifying stages thereof.

Referring first to Fig. 1, the numerals 10 and 11 refer to the input terminals of the present amplifier. The terminal 11 is grounded at 12. The input terminals 10 and 11 are arranged to supply an electrical signal to a pair of amplifying devices 13 and 14, shown here as triodes. The triode 13 includes a cathode 15, a control electrode 16, and an anode 17. The triode 14 comprises a cathode 18, a control electrode 19, and an anode 20.

The power supply for the circuit shown in Fig. 1 may be a conventional power supply except that it is floating, that is, the terminals of the power supply, B+ and B—, are not grounded. While a conventional amplifier power supply, if floating, is detrimental to the circuit operation, such is not the case in the present circuit because of the manner in which the output circuit is arranged with respect to the load or circuit output. The B+ terminal is connected to a supply lead 22 while the B— terminal is connected to a supply lead 23. The amplifying device 13 is connected to the supply leads 22 and 23 by means of a plate or anode resistor 24 and a cathode resistor 25, the latter of which is bypassed by a condenser 26. Amplifying device 14 is connected to the supply leads 22 and 23 by a direct connection 27 from the anode 20 to the lead 22 and a resistor 28 between the cathode 18 and the lead 23.

The input circuit to the triode 13 includes a resistor 29 which is connected in series between the control electrode 16 and the power supply lead 23. The resistor 29 and the resistor 25 and condenser 26 provide the bias for triode 13.

The output terminals for the apparatus are identified by the numerals 35 and 36. Output terminal 36 is directly connected to the cathode 18 of the amplifying device 14 while the output terminal 35 is connected to the anode 20 by way of a coupling condenser 37. The output terminal 36 is grounded and is in effect a continuation of the input grounded terminal 11.

In considering the operation of Fig. 1, it should first be noted that an alternating current signal applied to the input terminals 10 and 11, is passed through the amplifying devices 13 and 14 and then appears on the output terminals 35 and 36. The voltage applied to the input terminals will not appear on the output terminals in amplified form but it will be of substantially the same amplitude. In other words, the overall gain of the circuit is substantially unity. The output impedance across the terminals 35 and 36 will be very low, however, as this will be apparent from the discussion that follows.

Considering the operation of Fig. 1 more specifically, an input signal applied to the terminals 10 and 11 will be applied across the series circuit comprising the resistor 29 and the resistor 28. The resistor 29 is effectively in parallel with the grid cathode path of the triode 13. In other words, this signal will be applied to the control electrode 16 by a direct connection to the top of the resistor 29 and a connection to the cathode 15 by way of resistor 28 which is essentially connected to the cathode 15 by way of the cathode biasing network including resistor 25 and condenser 26. The signal applied to the input of the amplifying device 13 is amplified and is reproduced across the resistor 24 which is the plate load resistor for the device 13. The signal across the plate load resistor 24 is coupled directly to the control electrode 19 of the amplifying device 14. This signal will then control the current flow through the device 14. The output of the circuit is then taken directly from the anode 20 by way of condenser 37 to terminal 35 and from cathode 18 directly to the output terminal 36. The phasing of the output signal will be substantially the same as the phasing of the signal on the input terminals 10 and 11.

Figure 2:
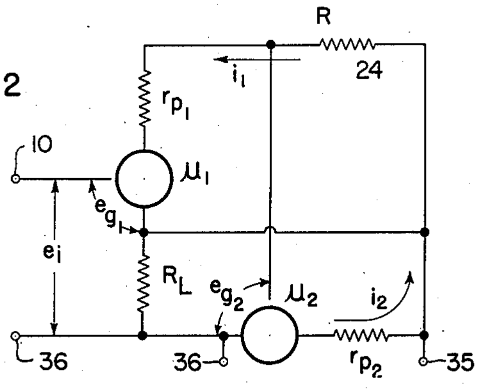
Fig. 2 is a representative eequivalent circuit for the circuit of Fig. 1.

The relationship of the overall circuit gain and the output impedances may be determined by reference to the equivalent circuit shown in Fig. 2. In the equivalent circuit of Fig. 2, the following table will show the representative circuit representations from the circuit of Fig. 1.

$e_i$=input signal
$e_{g1}$=grid-cathode input signal—triode 13
$r_{p1}$=internal plate resistance—triode 13
$\mu_1$=gain—triode 13
$R$=plate load resistor 24—triode 13
$i_1$=plate current—triode 13
$R_L$=load resistor 28—triode 14 in parallel with load on terminals 35 and 36. (Assuming the power supply impedance is negligible compared to resistor 28)
$e_{g2}$=grid-cathode input signal—triode 14
$r_{p2}$=internal plate resistance—triode 14
$\mu_2$=gain—triode 14
$i_2$=plate current—triode 14

The circuit may be analyzed mathematically and from this analysis, utilizing the foregoing symbols, it is possible to derive a representative equation for the output impedance and the overall circuit gain. The equations for this are as follows:

$$G=\frac{R_L}{R_L+\left(1+\frac{r_{p1}}{R}\right)\frac{r_{p2}+R_L(\mu_2+1)}{\mu_1\mu_2}}$$

As an example, the following values have been selected as representative values for determining the gain of the circuit $R_L=16\Omega$
$r_{p1}=15K\Omega$
$R=33K\Omega$
$r_{p2}=900\Omega$
$\mu_1=100$
$\mu_2=10$ Substitution of these values in the gain equation yields a gain of approximately 0.98.

The equation for the output impedance is as follows:

$$R_0=r_{p2}\frac{\left(1+\frac{r_{p1}}{R}\right)}{\mu_1\mu_2\left(1+\left(\frac{R+r_{p1}}{R}\right)\left(\frac{\mu_2+1}{\mu_1\mu_2}\right)\right)}$$

Substitution of the representative values given for determining circuit gain, the output impedance equals approximately 1.35 ohms. By using more than one tube in parallel in the output configuration, it is possible to reduce the output impedance to a fraction of an ohm. Also, the use of more than one tube in parallel allows higher output current to be derived from the circuit.

The foregoing equations and representative values readily represent the advantages that can be achieved with the present circuit in providing a very low output impedance while maintaining the gain of this circuit at substantially unity.

The characteristics of this circuit are adapted particularly for power amplification and low impedance output. With such a low impedance output, it is possible to achieve signal transmission to a low impedance utilization device without the necessity of an intermediary coupling transformer.

In the description above, it was pointed out that the power supply should be floating. This is not detrimental to this circuit because the impedance to ground of the power supply will be large compared to the output impedance. Consequently, with this impedance being effectively in parallel with the output load circuit, it will not affect the impedance thereof.

Figure 3:
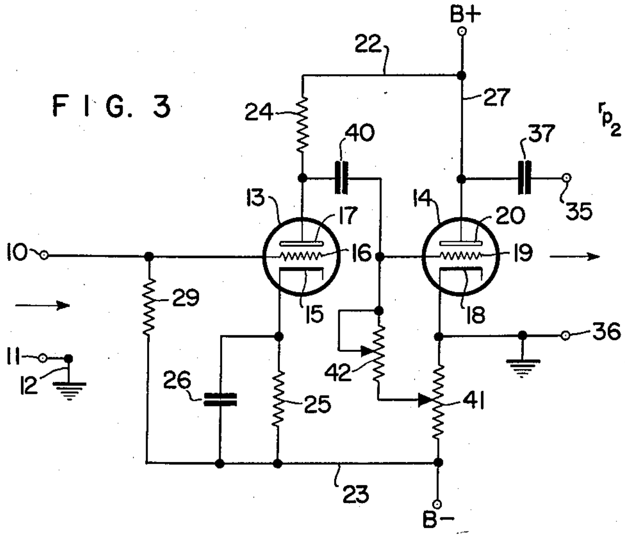
Fig. 3 shows a modified form of the apparatus wherein adjustable damping is obtained.
Figure 2A:
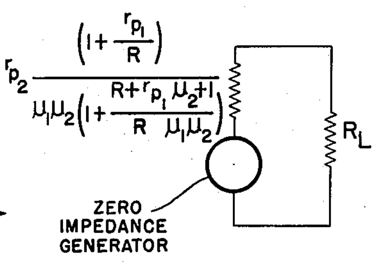
Fig. 2A is a further equivalent circuit for Fig. 1.

Referring now to Fig. 3, there is here shown a modified form of the amplifier of Fig. 1 where there is condenser coupling between the two amplifying stages and means are provided for varying the output impedance of the circuit or the damping of the circuit.

Circuit components common between Figs. 1 and 3 carry corresponding reference characters. Newly added to Fig. 3 is a coupling condenser 40 which couples the anode 17 to the control electrode 19. A further addition is the provision of a tapped load resistor 41 and an adjustable resistor 42, which is connected between the control electrode 19 and the tap of the load resistor 41.

The overall circuit functioning of the amplifier in Fig. 3 is substantially the same as that of Fig. 1. One change in the operation is necessary due to the coupling of the control electrode 19 to the load resistor 41 and this is in addition of the coupling condenser 40 which effectively blocks the flow of direct current between the circuits of the two amplifying devices 13 and 14. In addition, the variation of the slider of resistor 41 will produce a variation in the magnitude of the bias voltage applied to the input of tube 14.

The adjustment of the resistor 42 will vary the output impedance as will be evident by noting that resistor 42 is a part of the expression for R in the above equations. An increase in the magnitude of resistance of resistor 42 will decrease the output impedance in the range of practical values where the final term in the denominator is negligible. In other respects, the operation of the circuit is substantially the same as that of Fig. 1.

From the foregoing it will be readily apparent that there has been disclosed a new and improved amplifier circuit particularly adapted for output impedance matching purposes wherein a low output impedance utilization device is to be directly coupled to the output of the circuit.

While, in accordance with the provisions of the statutes, there has been illustrated and described a preferred embodiment of the invention, it will be apparent to those skilled in the art that changes may be made in the forms of the apparatus disclosed without departing from the spirit of the invention as set forth in the appended claims and that in some cases, certain features of the invention may be used to advantage without a corresponding use of other features.

Having now described the invention, what is claimed as new and for which it is desired to secure by Letters Patent is:

1. An electrical apparatus comprising a pair of electronic amplifying devices, each of said devices including anode, grid and cathode electrodes, a pair of input terminals connected, respectively, to the grid circuit of one of said pair of devices and the cathode of the other of said devices, means directly connecting the anode of said one device to the grid of said other device, a power supply having positive and negative terminals, a pair of resistors, one end of said resistors being connected, respectively, to the cathodes of said devices and the other end of said resistors being connected to the negative terminal of said power supply, means connecting said positive terminal of said power supply to said anodes, a pair of output terminals, and means connecting the anode and cathode, respectively, of said other device to said output terminals.

2. Apparatus as defined in claim 1 wherein said means connecting the anodes of both of said devices to the positive terminal of said power supply includes a resistor connected in the anode-power supply connection of said one device.

3. A low impedance amplifier comprising a pair of electronic amplifying devices each having an input signal electrode, an output signal electrode, and an electrode common to the input and output of the device, a source of power, a first resistor connecting the output electrode of one of said devices to a first terminal of said source of power, a second resistor connecting the common electrode of said one device to a second terminal of said source of power, means coupling the output electrode of said one device to the input electrode of the other of said devices, a third resistor connecting the common electrode of said other device to said second terminal of said source of power, means connecting the output electrode of said other device directly to said first terminal of said source of power, a pair of input terminals connected, respectively, to the input electrode of said one device and to the common electrode of said other device, and a pair of output terminals connected, respectively, to the common electrode and the output electrode of said other device.

4. An amplifier as defined in claim 3 wherein an adjustable resistor is connected between the input electrode of said other device and said third resistor.

5. An amplifier as defined in claim 4 wherein said adjustable resistor is connected to an adjustable tap on said third resistor.

References Cited in the file of this patent

UNITED STATES PATENTS

| | | |
|---|---|---|
| 2,284,064 | Morgan | May 26, 1942 |
| 2,313,122 | Brubacker | Mar. 9, 1943 |
| 2,483,410 | Grieg et al. | Oct. 4, 1949 |
| 2,516,865 | Ginzton | Aug. 1, 1950 |
| 2,559,515 | Pourciau | July 3, 1951 |
| 2,571,112 | Cowles | Oct. 16, 1951 |
| 2,593,391 | Bray | Apr. 15, 1952 |
| 2,737,547 | Deming | Mar. 6, 1956 |
| 2,775,656 | Hounsfield | Dec. 25, 1956 |
| 2,788,397 | Chauvin et al. | Apr. 9, 1957 |